(12) United States Patent
Lee

(10) Patent No.: US 9,773,929 B2
(45) Date of Patent: Sep. 26, 2017

(54) SOLAR CELL AND METHOD OF FABRICATING THE SAME

(71) Applicant: LG INNOTEK CO., LTD., Seoul (KR)

(72) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 475 days.

(21) Appl. No.: 14/359,548

(22) PCT Filed: Nov. 21, 2012

(86) PCT No.: PCT/KR2012/009867
§ 371 (c)(1),
(2) Date: May 20, 2014

(87) PCT Pub. No.: WO2013/077626
PCT Pub. Date: May 30, 2013

(65) Prior Publication Data
US 2014/0338742 A1    Nov. 20, 2014

(30) Foreign Application Priority Data

Nov. 21, 2011   (KR) .......................... 10-2011-0121870

(51) Int. Cl.
*H01L 31/00* (2006.01)
*H01L 31/0224* (2006.01)
(Continued)

(52) U.S. Cl.
CPC .... *H01L 31/022441* (2013.01); *H01L 31/024* (2013.01); *H01L 31/022425* (2013.01);
(Continued)

(58) Field of Classification Search
CPC .............................................. H01L 31/022425
See application file for complete search history.

(56) References Cited

U.S. PATENT DOCUMENTS 4,798,808 A * 1/1989 Berman ................ H01L 21/288
                                                    136/256
6,297,555 B1* 10/2001 Zhao ................ H01L 21/76843
                                                    257/743
(Continued)

FOREIGN PATENT DOCUMENTS

JP     2001-093591 A     4/2001
JP     2003-282909 A    10/2003
(Continued)

OTHER PUBLICATIONS

Bommersbach et al., "Influence of Mo back contact porosity on co-evaporated Cu(In,Ga)Se2 thin film properties and related solar cell," Prog. Photovolt: Res. Appl. 2013; 21:332-343 (2011).*

(Continued)

*Primary Examiner* — Luan Van
*Assistant Examiner* — Angelo Trivisonno
(74) *Attorney, Agent, or Firm* — Saliwanchik, Lloyd & Eisenschenk

(57) ABSTRACT

Disclosed are a solar cell and a method of fabricating the same. The solar cell includes a support substrate, a back electrode layer on the support substrate, a light absorbing layer on the back electrode layer, and a front electrode layer on the light absorbing layer. The back electrode layer includes at least three layers. The method includes forming a first layer on a support substrate, forming a second layer on the first layer, forming a third layer on the second layer, forming a light absorbing layer on the third layer, and forming a front electrode layer on the light absorbing layer.

7 Claims, 1 Drawing Sheet

(51) Int. Cl.
*H01L 31/0392* (2006.01)
*H01L 31/024* (2014.01)
*H01L 31/0463* (2014.01)

(52) U.S. Cl.
CPC .... *H01L 31/03923* (2013.01); *H01L 31/0463* (2014.12); *Y02E 10/541* (2013.01)

(56) References Cited

U.S. PATENT DOCUMENTS

| | | | |
|---|---|---|---|
| 2005/0236032 A1 | 10/2005 | Aoki | |
| 2008/0271781 A1* | 11/2008 | Kushiya | H01L 31/0322 136/256 |
| 2009/0020157 A1* | 1/2009 | Krasnov | H01L 31/022425 136/256 |
| 2012/0055543 A1* | 3/2012 | Pinarbasi | H01L 31/0322 136/256 |
| 2012/0073646 A1* | 3/2012 | Jee | H01L 31/022425 136/256 |
| 2012/0318352 A1* | 12/2012 | Korevaar | H01L 31/022425 136/259 |

FOREIGN PATENT DOCUMENTS

| | | | | |
|---|---|---|---|---|
| KR | 10-2010-0134879 A | | 12/2010 | |
| KR | 20100134879 A | * | 12/2010 | ..... H01L 31/022425 |

OTHER PUBLICATIONS

International Search Report in International Application No. PCT/KR2012/009867, filed Nov. 21, 2012.

* cited by examiner

[Fig. 1]
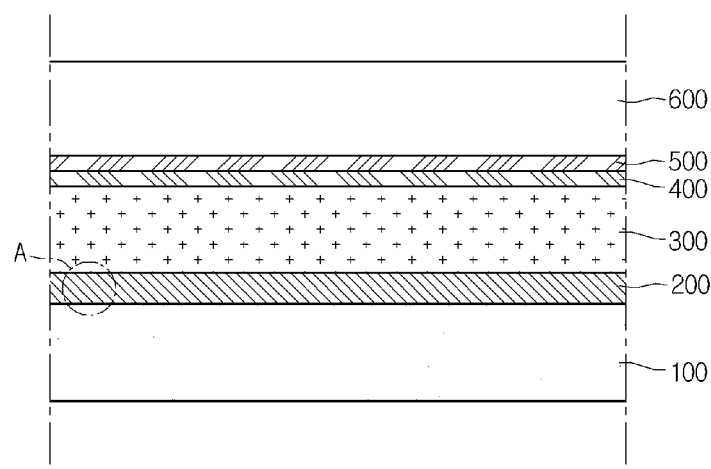
[Fig. 2]
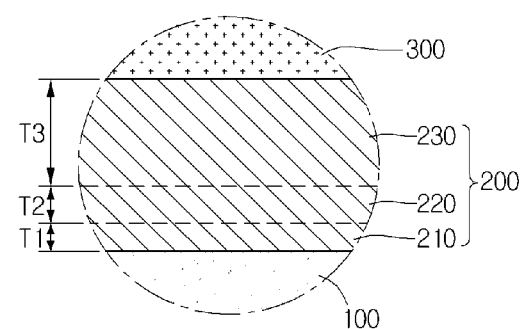

SOLAR CELL AND METHOD OF FABRICATING THE SAME

CROSS-REFERENCE TO RELATED APPLICATIONS

This application is the U.S. national stage application of International Patent Application No. PCT/KR2012/009867, filed Nov. 21, 2012, which claims priority to Korean Application No. 10-2011-0121870, filed Nov. 21, 2011, the disclosures of each of which are incorporated herein by reference in their entirety.

TECHNICAL FIELD

The embodiment relates to a solar cell and a method of fabricating the same.

BACKGROUND ART

A method of fabricating a solar cell for solar light power generation is as follows. First, after preparing a substrate, a back electrode layer is formed on the substrate and patterned by a laser, thereby forming a plurality of back electrodes.

Thereafter, a light absorbing layer, a buffer layer, and a high resistance buffer layer are sequentially formed on the back electrodes. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy band gap of the light absorbing layer is in the range of about 1 eV to about 1.8 eV.

Then, a buffer layer including cadmium sulfide (CdS) is formed on the light absorbing layer through a sputtering process. The energy bandgap of the buffer layer may be in the range of about 2.2 eV to about 2.4 eV. After that, a high resistance buffer layer including zinc oxide (ZnO) is formed on the buffer layer through the sputtering process. The energy bandgap of the high resistance buffer layer is in the range of about 3.1 eV to about 3.3 eV.

Thereafter, a groove pattern may be formed in the light absorbing layer, the buffer layer, and the high resistance buffer layer.

After that, a transparent conductive material is laminated on the high resistance buffer layer, and is filled in the groove pattern. Therefore, a transparent electrode layer is formed on the high resistance buffer layer, and connection wires are formed in the groove pattern. A material constituting the transparent electrode layer and the connection wireless may include aluminum doped zinc oxide (AZO). The energy bandgap of the transparent electrode layer may be in the range of about 3.1 eV to about 3.3 eV.

Then, the groove pattern is formed in the transparent electrode layer, so that a plurality of solar cells may be formed. The transparent electrodes and the high resistance buffers correspond to the cells, respectively. The transparent electrodes and the high resistance buffers may be provided in the form of a stripe or a matrix.

The transparent electrodes and the back electrodes are misaligned from each other and electrically connected with each other through the connection wires. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

Meanwhile, a P1 process is performed to typically pattern a back electrode layer by using a laser, and to form the back electrode layer in the unit cell to allow the series-connection of the back electrode layer. In this case, in the back electrode layer deposited on the support substrate, the back electrode layer provided at the edge region subject to a laser process may be separated from the substrate or delaminated from the substrate due to the thermal shock and the shock wave caused by the laser. The defects may provide an electrical shunt path or may cause electrical loss, after the subsequent processes have been performed.

DISCLOSURE OF INVENTION

Technical Problem

The embodiment provides a solar cell capable of representing improved reliability.

Solution to Problem

According to the embodiment, there is provided a solar cell including a support substrate, a back electrode layer on the support substrate, a light absorbing layer on the back electrode layer, and a front electrode layer on the light absorbing layer. The back electrode layer includes at least three layers.

According to the embodiment, there is provided a method of fabricating a solar cell including forming a first layer on a support substrate, forming a second layer on the first layer, forming a third layer on the second layer, forming a light absorbing layer on the third layer, and forming a front electrode layer on the light absorbing layer.

Advantageous Effects of Invention

The solar cell according to the embodiment includes the back electrode layer, and the back electrode layer includes the first to third layers. The first to third layers have different fine structures to mitigate the thermal expansion and thermal contraction according to the layers. In other words, when performing a P1 process with respect to the back electrode layer, the different fine structures of the first to third layers serve as a buffer against the shock wave by the laser. In other words, the thermal contraction is gradually performed in the first to third layers 210 to 230, so that a burr phenomenon or a lift off phenomenon may be prevented. Accordingly, the defects can be prevented from being caused by the laser process of the solar cell. Therefore, the shunt path and the structural short can be prevented after the subsequent process has been performed, so that the reliability can be ensured.

BRIEF DESCRIPTION OF DRAWINGS

FIG. 1 is a sectional view showing a solar cell according to the embodiment; and FIG. 2 is an enlarged view showing a part A of FIG. 1.

MODE FOR THE INVENTION

In the description of the embodiments, it will be understood that, when a layer (film), a region, a pattern, or a structure, is referred to as being "on" or "under" another substrate, another layer (film), another region, another pad, or another pattern, it can be "directly" or "indirectly" on the other substrate, the other layer (film), the other region, the other pad, or the other pattern, one or more intervening layers may also be present. Such a position of each layer has been described with reference to the drawings.

The thickness and size of each layer (film), each region, each pattern, or each structure shown in the drawings may be exaggerated, omitted or schematically drawn for the purpose of convenience or clarity. In addition, the size of each layer (film), each region, each pattern, or each structure does not utterly reflect an actual size.

Hereinafter, the embodiment of the disclosure will be described in detail with reference to accompanying drawings.

Hereinafter, the solar cell according to the first embodiment will be described in detail with reference to FIGS. 1 and 2. FIG. 1 is a sectional view showing a solar cell according to the embodiment, and FIG. 2 is an enlarged view showing a part A of FIG. 1.

Referring to FIGS. 1 and 2, the solar cell includes a support substrate 100, an adhesion enhancement layer 700, a back electrode layer 200, a light absorbing layer 300, a buffer layer 400, a high resistance buffer layer 500, and a front electrode layer 600.

The support substrate 100 has a plate shape and supports the back electrode layer 200, the light absorbing layer 300, the buffer layer 400, and the front electrode layer 600.

The support substrate 100 may be an insulator. The support substrate 100 may be a glass substrate, a plastic substrate or a metal substrate. In detail, the support substrate 100 may be a soda lime glass substrate. The support substrate 100 may be transparent.

The back electrode layer 200 is provided on a top surface of the support substrate 100. The back electrode layer 200 is a conductive layer. For example, a material constituting the back electrode layer 200 may include metal such as molybdenum (Mo).

The back electrode layer 200 may include at least three layers. In this case, the layers may be formed by the same metal or different metals.

In detail, referring to FIG. 2, the back electrode layer 200 may include first to third layers 210, 220, and 230.

The first layer 210 may be placed on the support substrate 100. The first layer 210 may make contact with the support substrate 100. The first layer 210 may include a material the same as a material constituting the third layer 230. In other words, the first layer 210 may include metal such as Mo or molly sodium (MoNa), but the embodiment is not limited thereto. In other words, the first layer 210 may serve as a barrier layer including silicon oxide (SiO2), silicon nitride (Si3N4), or titanium nitride (TiN). In other words, the first layer 210 serves as the barrier layer, thereby preventing the efficiency of the solar cell from being degraded due to the spreading of iron (Fe) from the support substrate 100 when the support substrate 100 is a metallic substrate.

The second layer 220 is provided on the first layer 210. The second layer 220 may include metal such as Mo or MoNa.

The third layer 230 is provided on the second layer 220. The third layer 230 may include metal such as Mo or MoNa.

The first layer 210 may include a plurality of pores. The porosity of the first layer 210 is smaller than that of the second layer 220 or the third layer 230. The first layer 210 includes a plurality of pores to serve as a buffer between the second and third layers 220 and 230 placed on the first layer 210 and the support substrate 100.

The first layer 210 includes first particles. The second layer 220 includes second particles. The third layer 230 includes third particles. In this case, the sizes of the first to third particles satisfy following Equation 1.

Size of third particle>size of second particle>size of first particle $\quad$ Equation 1

The third particles are provided in the largest size, thereby reducing the resistance of the back electrode layer 200. In addition, the first particles of the first layer 210 making contact with the support substrate 100 are provided in the smallest size, thereby improving the adhesive strength with the support substrate 100.

Thereafter, thicknesses of the first layer 210, the second layer 220, and the third layer 230 satisfy following Equation 2.

1≤thickness(T3) of third layer/thickness(T1) of first layer+thickness(T2) of second layer)≤2 $\quad$ Equation 2

If the value of (the thickness (T3) of the third layer/(the thickness (T1) of the first layer+the thickness (T2) of the second layer)) is less than 1 or greater than 2, the first layer 210 may not serve as a buffer.

The first layer 210, the second layer 220, and the third layer 230 have different fine structures to mitigate the thermal expansion and thermal contraction according to the layers. In detail, a P1 process is typically performed to pattern the back electrode layer 200 by using a laser, and form the back electrode layer 200 in the unit cell to allow the series-connection of the back electrode layer 200. When the P1 process is performed, the different fine structures of the first to third layers 210 to 230 serve as a buffer against the shock wave caused by the laser. In other words, the thermal contraction is gradually performed in the first to third layers 210 to 230, so that a burr phenomenon or a lift off phenomenon may be prevented. Accordingly, the solar cell can be prevented from being defected by a laser process, and the shunt path and the structural short caused after the subsequent processes have been performed can be prevented, so that the reliability can be ensured.

The light absorbing layer 300 is provided on the back electrode layer 200. The light absorbing layer 300 includes a group I-III-VI compound. For example, the light absorbing layer 300 may have the CIGSS (Cu(IN, Ga)(Se, S)2) crystal structure, the CISS (Cu(IN)(Se,S)2) crystal structure or the CGSS (Cu(Ga)(Se, S)2) crystal structure.

The energy bandgap of the light absorbing layer 300 may be in the range of about 1 eV to about 1.8 eV.

The buffer layer 400 is provided on the light absorbing layer 300. The buffer layer 400 makes directly contact with the light absorbing layer 300.

The buffer layer 400 may include a sulfide. For example, the buffer layer 400 may include cadmium sulfide (CdS).

The high resistance buffer layer 500 is provided on the buffer layer 400. The high resistance buffer layer 500 includes i-ZnO which is not doped with impurities. The energy bandgap of the high resistance buffer layer 500 may be in the range of about 3.1 eV to about 3.3 eV.

The front electrode layer 600 is provided on the light absorbing layer 300. In more detail, the front electrode layer 600 is provided on the high resistance buffer layer 500.

The front electrode layer 600 may be transparent. For example, a material constituting the front electrode layer 600 may include an Al doped zinc oxide (AZO), an indium zinc oxide (IZO), or an indium tin oxide (ITO)

The front electrode layer 600 may have a thickness in the range of about 500 nm to about 1.5 μm. When the front electrode layer 600 is formed by the Al doped zinc oxide (AZO), aluminum (Al) may be doped at the rate of about 1.5 wt % to about 3.5 wt %. The front electrode layer 600 is a conductive layer.

Hereinafter, a method of fabricating the solar cell according to the embodiment. In the following description, the details of structures and components the same as those of the above description or extremely similar to those of the above description will be omitted for the purpose of clear and simple explanation.

The method of fabricating the solar cell according to the embodiment includes the steps of forming the first layer 210, forming the second layer 220, forming the third layer 230, forming the light absorbing layer, and forming the front electrode layer.

First, the back electrode layer 200 including the first layer 210, the second layer 220, and the third layer 230 may be formed on the support substrate 100. In detail, the first layer 210 may be formed on the support substrate 100. The second layer 220 may be formed on the first layer 210. The third layer 230 may be formed on the second layer 220. The first layer 210, the second layer 220, and the third layer 230 may be formed through a deposition process. For example, the first layer 210, the second layer 220, and the third layer 230 may be formed through a sputtering process. The first layer 210, the second layer 220, and the third layer 230 may be formed through three processes having different process conditions. Accordingly, when the first layer 210, the second layer 220, and the third layer 230 are formed, the first layer 210, the second layer 220, and the third layer 230 may be formed in different fine structures by employing different process conditions. For example, the porosities of the first layer 210, the second layer 220, and the third layer 230 may be adjusted by adjusting the vacuum power or the gas partial pressure.

Meanwhile, an additional layer such as an anti-diffusion layer may be interposed between the support substrate 100 and the back electrode layer 200.

Hereinafter, the light absorbing layer 300 is formed on the back electrode layer 200. The light absorbing layer 300 may be formed through a sputtering process or an evaporation scheme.

For example, in order to form the light absorbing layer 300, a scheme of forming a Cu(In,Ga)Se2 (CIGS) based-light absorbing layer 300 by simultaneously or separately evaporating Cu, In, Ga, and Se and a scheme of performing a selenization process after forming a metallic precursor film have been extensively performed.

Regarding the details of the selenization process after forming the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se2 (CIGS) based-light absorbing layer 300 is formed.

In addition, the sputtering process employing the Cu target, the In target, and the Ga target and the selenization process may be simultaneously performed.

In addition, a CIS or a CIG light absorbing layer 300 may be formed through a sputtering process employing only Cu and In targets or only Cu and Ga targets and the selenization process.

Thereafter, the step of forming the buffer layer 400 on the light absorbing layer 300 is performed. In this case, the buffer layer 400 may be formed after depositing CdS through a sputtering process or a CBD (chemical bath deposition) scheme.

Thereafter, the high resistance buffer layer 500 may be formed by depositing zinc oxide on the buffer layer 400 through a sputtering process.

The buffer layer 400 and the high resistance buffer layer 500 are deposited at a low thickness. For example, the thicknesses of the buffer layer 400 and the high resistance buffer layer 500 may be in the range of about 1 nm to about 80 nm.

The step of forming the front electrode layer 600 on the high resistance buffer layer 500 is performed. The front electrode layer 600 may be formed by depositing a transparent conductive material such as Al doped zinc oxide (AZO) on the high resistance buffer layer 500 through a sputtering process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a support substrate;
   a back electrode layer on the support substrate;
   a light absorbing layer on the back electrode layer; and
   a front electrode layer on the light absorbing layer;
   wherein the back electrode layer includes a first layer on the support substrate, a second layer on the first layer, and a third layer on the second layer;
   wherein the first layer is in direct physical contact with the support substrate, the second layer is in direct physical contact with the first layer, and the third layer is in direct physical contact with the second layer;
   wherein each of the first layer, the second layer, and the third layer comprises molybdenum (Mo) or molybdenum-sodium (MoNa);
   wherein each of the first layer, the second layer, and the third layer comprises a plurality of pores;
   wherein a porosity of the first layer is less than a porosity of the second layer or a porosity of the third layer;
   wherein a thickness of the third layer is greater than a thickness of the second layer;
   wherein the first layer includes first particles, the second layer includes second particles, and the third layer includes third particles;

wherein a size of each third particle is greater than a size of each second particle; and
wherein the size of each second particle is greater than or equal to a size of each first particle.

2. The solar cell of claim 1, wherein a thickness of each of the first to third layers satisfy Equation 2, $$1 \leq \text{thickness of third layer}/(\text{thickness of first layer} + \text{thickness of second layer}) \leq 2. \quad \text{Equation 2}$$

3. The solar cell of claim 1, further comprising a first buffer layer on the light absorbing layer, and a second buffer layer on the first buffer layer,
wherein a resistance of the second buffer layer is greater than that of the first buffer layer.

4. The solar cell of claim 3, wherein the second buffer layer includes Zinc Oxide that is not doped with impurities.

5. The solar cell of claim 3, wherein the first buffer layer makes direct contact with the light absorbing layer.

6. The solar cell of claim 1, wherein the front electrode layer is formed by an Al doped zinc oxide, and
wherein the aluminum is doped at the rate of 1.5 wt % to 3.5 wt %.

7. The solar cell of claim 1, wherein each of the first layer, the second layer, and the third layer comprises MoNa.

* * * * *